United States Patent [19]

Pennington

[11] Patent Number: 4,882,664
[45] Date of Patent: Nov. 21, 1989

[54] SYNCHRONOUS MODULATION CIRCUIT

[75] Inventor: Terris L. Pennington, Edmonds, Wash.

[73] Assignee: Rane Corporation, Everett, Wash.

[21] Appl. No.: 204,033

[22] Filed: Jun. 8, 1988

[51] Int. Cl.[4] ............................................. H02M 1/12
[52] U.S. Cl. ....................................... 363/41; 363/127
[58] Field of Search ................. 363/16, 41, 127, 131, 363/133, 134, 40, 26, 97

[56] References Cited

U.S. PATENT DOCUMENTS

| 3,735,235 | 5/1973 | Hamilton et al. | 363/26 |
| 4,353,115 | 10/1982 | Ruble et al. | 363/134 X |
| 4,399,499 | 8/1983 | Butcher et al. | 363/127 X |
| 4,479,175 | 10/1984 | Gille et al. | 363/41 |
| 4,626,746 | 12/1986 | Zaverei | 315/208 |
| 4,716,514 | 12/1987 | Patel | 363/127 |

OTHER PUBLICATIONS

Turnbull, G. F., and Townsend, J. M., "Efficiency Considerations in a Class D Amplifier", Wireless World, Apr. 1967, pp. 154–158.
Johnson, K. C., "1: Class D Principles Analysis", Wireless World, Dec. 1967, pp. 576–580.
Suzuki, Tadao, "Application of Vertical FET for Pulse Width Modulation Audio Power Amplifier", presented at the 55th Convention of Audio Engineering Soc., Nov. 1, 1976, Preprint #1158.
Attwood, Brian E., "Very High Fidelity Quartz Controlled PMW (Class D) Stereo Amplifiers for Consumer and Professional Use", presented at 59th Convention of Audio Engrg. Soc., Feb. 28–Mar. 3, 1978, Preprint #1331.
Motorola, Inc., Linear/Switch Voltage Regulator Handbook, Second U.S. Edition, 1982, pp. 109–110.
Chryssis, George, High Frequency Switching Power Supplies, "Switching Regulator Control Circuits," McGraw-Hill Book Co., 1984, pp. 134–137.

Primary Examiner—Patrick R. Salce
Assistant Examiner—Kristine Peckman
Attorney, Agent, or Firm—Larry A. Jackson

[57] ABSTRACT

In pulse width modulation (PWM) power regulation and amplification circuits, separate DC rectification and filtering circuitry is eliminated by providing synchronous output switching directly from an available AC source. Output switch steering logic connected to an AC power source, such as a square wave AC signal available at the secondary of an isolation transformer, receives the PWM control signal that is developed by a conventional pulse width modulator in response to an input signal and causes an output switch stage to selectively and synchronously connect the alternating current power across the load with the proper timing and polarity. Preferably the output switching stage includes a low pass filter for filtering out the higher frequency switching transients.

7 Claims, 4 Drawing Sheets

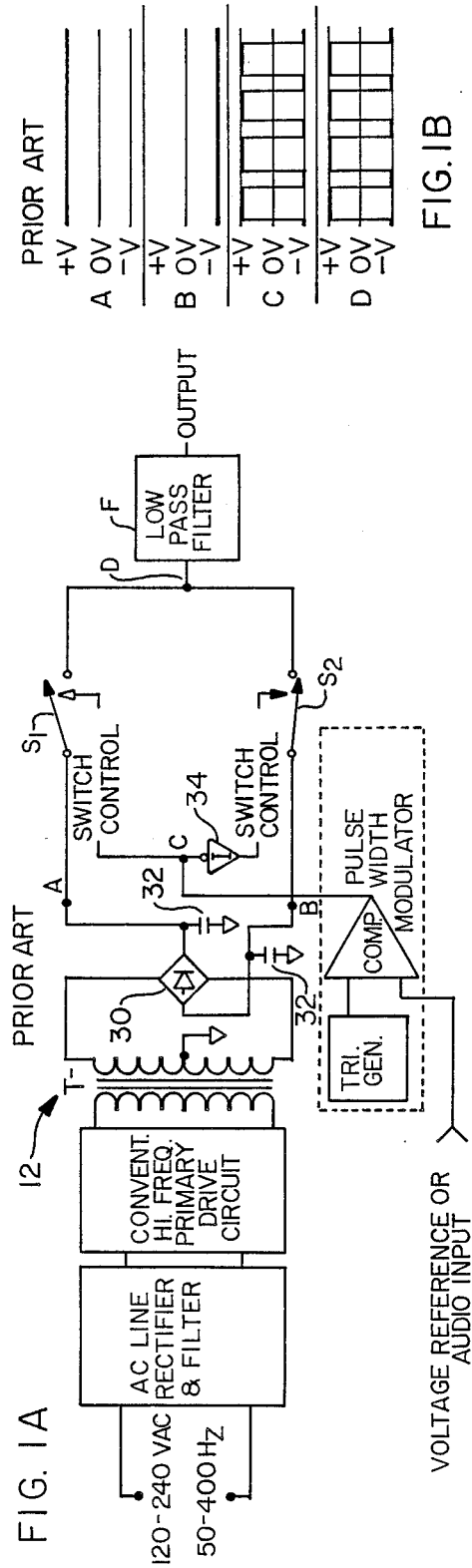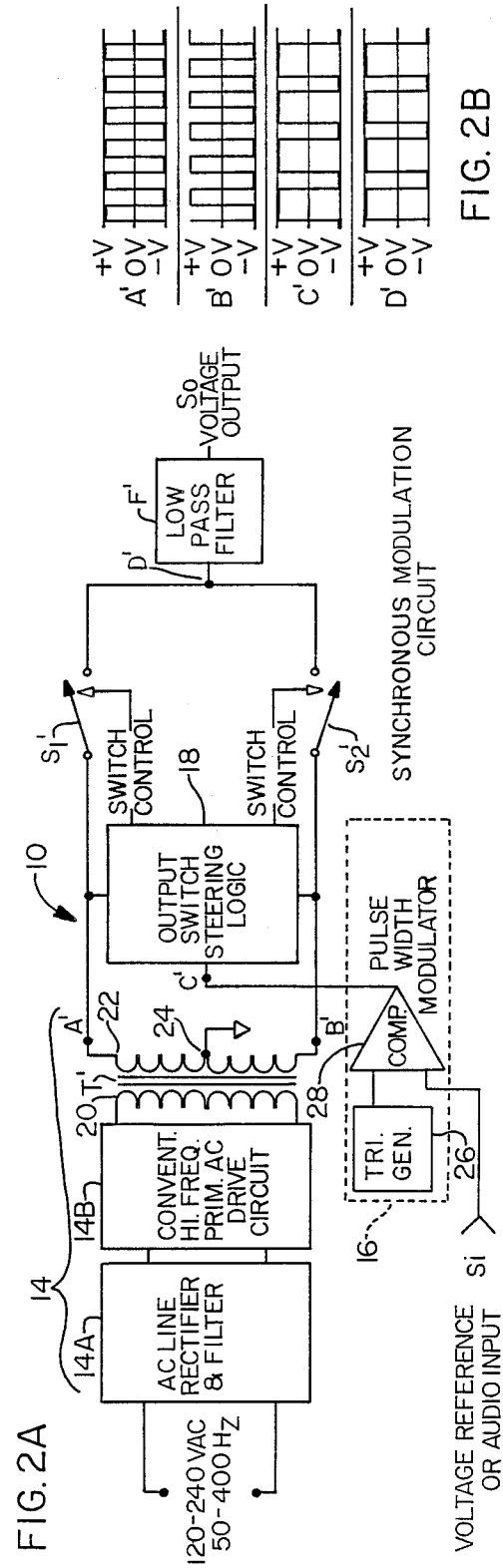

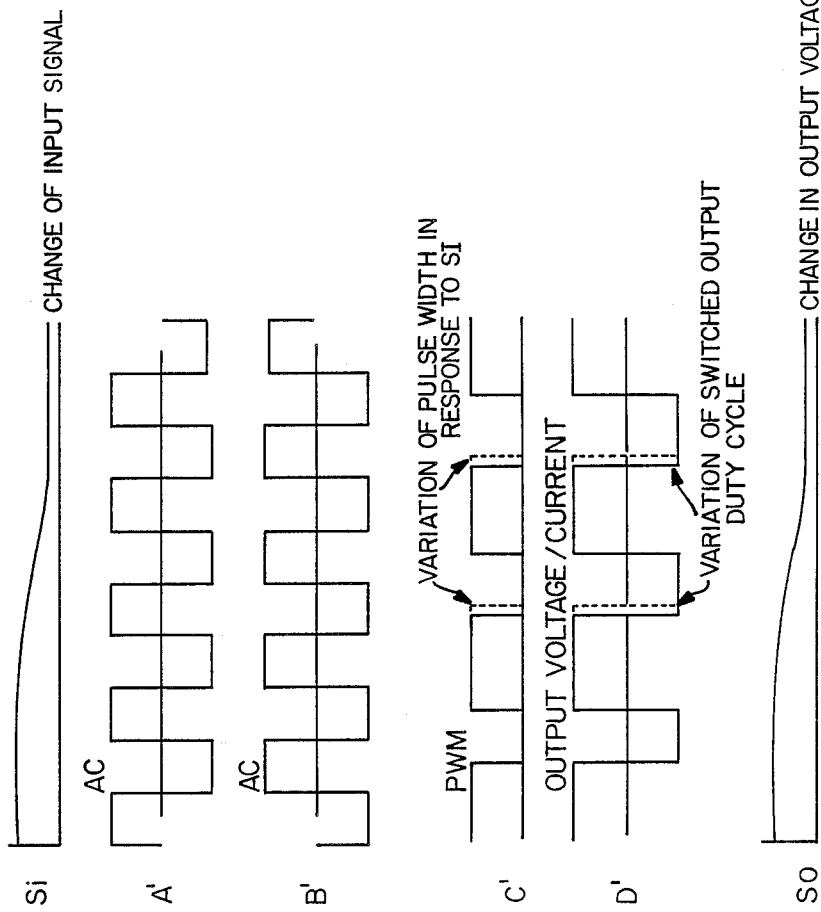

SYNCHRONOUS MODULATION CIRCUIT

BACKGROUND OF THE INVENTION

The present invention relates to circuits used in power supplies and amplifiers, and more particularly to the use of pulse width modulation in power supply and amplifier circuitry.

Power supplies and amplifiers have previously been designed to incorporate pulse width modulation in order to achieve higher operating efficiency, lower part count and, hence, higher reliability. In such circuit designs, a pulse width modulated signal is developed in response to an input reference signal which may be a rapidly varying signal, such as an audio input, or a slowly varying reference voltage in the case of regulated power supplies and control system circuitry.

In audio amplifiers, for example, it is well known that pulse width modulation (PWM) can be effectively used in a Class D amplifier configuration to control the amount of power delivered to an output load, such as a loudspeaker: G. F. Turnbull, M.Sc., and J. M. Townsend, M.Sc., "Efficiency Considerations in a Class D Amplifier", *Wireless World*, April 1967, pp. 154–158; K. C. Johnson, M.A., "1: Class D Principles Analysed", *Wireless World*, December 1967, pp. 576–580; Tadao Suzuki, "Application of Vertical FET for Pulse Width Modulation Audio Power Amplifier", presented at 55th Convention of Audio Engineering Society, Nov. 1, 1976, Preprint No. 1158; Brian E. Attwood, "Very High Fidelity Quartz Controlled PWM (Class D) Stereo Amplifiers for Consumer and Professional Use", presented at 59th Convention of Audio Engineering Society, Feb. 28-Mar. 3, 1978, Preprint No. 1331.

In such prior designs, a source of AC line power is converted by rectification and filtering to DC and a controlled amount of this DC power is switched to the loud-speaker connected as the output load. The DC is applied to the load cyclically by switching transistors or other solid state switches operated at a variable duty cycle in response to the audio input signal. The duty cycle of the DC to load switching is controlled by converting the input signal into a PWM signal such that the width of each pulse in a cycle varies according to the amplitude of the input signal. The duty cycle (duration during each cycle that the DC is connected across the load) is then varied according to the widths of the pulses of the PWM signal. The average energy or power delivered to the load thus changes according to the amplitude of the input signal. Since the voltage signal applied across the load includes the switching transients of the modulation cycle, a low pass filter is usually employed to pass just the audio or other input signal information and exclude the relatively higher frequency switching transient components.

Similar circuits are used in servo control systems in which the input is a varying control signal and the output load is, for example, an electromechanical device.

For other applications, such as a regulated power supply output, the input signal is a reference voltage and the output load is the electrical appliance, circuit or other powered impedance connected to the power supply. It is common in the case of such regulated power supplies to convert an available AC line power, such as a 120 volt-400 Hz line power, common, for example, in the aircraft industry, to DC using rectification and filtering. Then the resulting DC is cyclically connected across the load in accordance with a PWM control signal that varies in pulse width in accordance with the reference signal. The average power delivered to the load is thus regulated by the reference which may be a feedback error signal responsive to the load power.

In all of these applications, power supply regulation, audio and control signal amplification, the PWM configuration significantly reduces power consumption as well as minimizing the number of electrical components, hence increasing the reliability of such designs.

Examples of PWM designs for power supplies and control systems are found in the following representative collection of prior art patents and literature: *Linear/Switchmode Voltage Regulator Handbook*, Second U.S. Edition, MOTOROLA INC., 1982, pp. 109–110; George Chryssis, *High Frequency Switching Power Supplies*, "Switching Regulator Control Circuits", McGraw-Hill Book Co., 1984, pp. 134–137; Andrew Zaderej, U.S. Pat. No. 4,626,746 for POWER CONTROL CIRCUIT, issued Dec. 2, 1986; Billy Harold Hamilton, Helmut Wilhart, U.S. Pat. No. 3,735,235 for DC TO DC CONVERTER WITH VOLTAGE REGULATION FEEDBACK LOOP------, issued May 22, 1973.

SUMMARY OF THE INVENTION

The present invention improves existing PWM amplification and power supply regulation circuits by eliminating a separate rectification and filtering stage and providing synchronous output switching directly from an AC source. This is achieved by a unique output switch steering logic connected between the AC power source, such as a square wave AC signal available at the transformer secondary of a conventional power source, and an output switch stage. The output switch steering logic receives a PWM control signal that is developed by conventional pulse width modulation circuitry in response to an input signal, and causes the output switch stage to selectively and synchronously connect the alternating current power across the load with the proper timing and polarity. Preferably the output switch stage includes a low pass filter for filtering out the higher frequency switching transients.

In a preferred embodiment, the output switch steering logic includes first and second logic sections, one for each of first and second power semiconductor switches arranged to connect opposing polarity terminals of the alternating current source to the output load. Each logic section or network senses the polarity of the alternating current power signal and the instantaneous state of the pulse width modulated input signal. From these signals, the steering logic determines which of the first and second power switches to close and at what phase of the cycle so that power delivered to the load properly reflects the level of the input signal.

In this preferred embodiment, the alternating current power source is provided at the output secondary of a transformer of a switchmode power source. As known per se, such a power source provides at the transformer secondary a square wave AC signal. The sharp leading and falling edges of this square wave signal cause crisp switching of the output switches by the steering logic. Also, the AC power source is preferably of a frequency selected to be relatively high compared to the input signal so that it does not interfere with frequencies containing input information. For example, in an audio system, the frequency of the AC power signal should be at least as high as the audible frequency range of the input signal.

Pulse width modulation of the input signal is preferably provided by a sawtooth or triangular waveform function generator cooperating with a comparator circuit of a type that can be synchronized to the phase of the alternating current power signal. This synchronizes the pulse width modulated signal to the AC power signal so that the steering logic operates synchronously in response to the combined phase conditions of the AC power signal and the pulse width modulated signal.

By the above arrangement of circuit components, the steering logic eliminates the need for separate rectification diodes, filter capacitors, and other components normally found in converting AC to DC in the power source stage and thereby achieves higher operating efficiency, lower manufacturing cost and increased reliability.

These and further features, objects and advantages of the invention will become apparent to those skilled in the art from the following detailed description and appended drawings.

BRIEF DESCRIPTION OF THE DRAWINGS

FIG. 1a is a block and schematic diagram of a conventional pulse width modulation amplifier as used in prior art system.

FIG. 1b is a set of electrical waveforms that represent the operation of the prior art circuit of FIG. 1a.

FIG. 2a is a composite block and schematic diagram of one simplified form of a synchronous modulation circuit (e.g. amplifier or power supply) according to the present invention.

FIG. 2b is a set of waveforms for the circuit of FIG. 2a, and is drawn to the same amplitude and time scales as the FIG. 1b waveforms for ease of comparison.

FIG. 3b is a set of signal waveforms representing the phase and amplitude relationships of signals occurring at various points in the amplifier circuit of FIG. 3a.

FIG. 3c is a truth table showing the relationship between the input signals to the switch steering logic and the corresponding output logic conditions from the steering logic that determine the closure of the output power switches.

DETAILED DESCRIPTION OF PREFERRED EMBODIMENTS

Figure 3A:
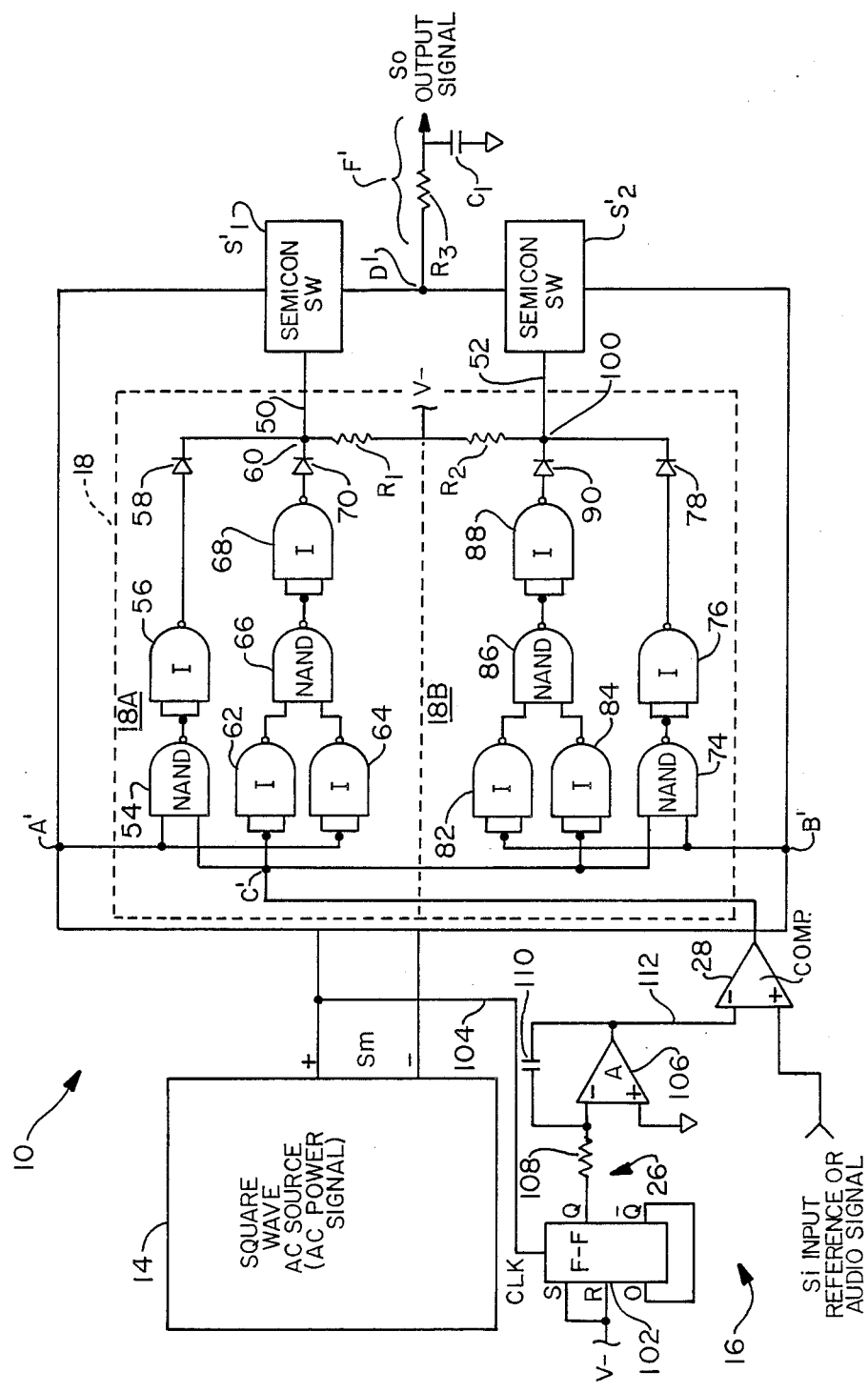
FIG. 3a is a composite block and schematic diagram that depicts in greater detail the steering logic, output filtering, and pulse width modulation in a preferred embodiment of the synchronous modulation circuit of the invention used as an audio amplifier.

A simplified diagram of the synchronous modulation circuit 10 according to the present invention is shown in FIG. 2a. For comparison, a prior art pulse width modulation amplifier 12 appears in FIG. 1a. Characteristic waveforms of circuit 10 of the invention are shown in FIG. 2b, and again, for comparison, characteristic waveforms of the prior art amplifier 12 appear in FIG. 1b.

Synchronous modulation circuit 10 is shown to include: a source of alternating current power 14, an input signal Si (either voltage reference, audio or other control signal), a pulse width modulator 16, an ouput switch steering logic 18, signal controlled output switches S1' and S2', and a low pass filter F' from which the output signal So is derived.

Alternating current power source 14 is here generated by an AC line rectifier and filter circuit 14a connected to receive AC line power in the range of 120 to 240 VAC at a frequency in the range of 50 to 400 Hz. AC line rectifier and filter circuit 14a provides filtered DC that in turn is converted to relatively high frequency alternating current by a chopper or other conventional switchmode circuitry of well known design. Such switchmode circuitry is here shown as high frequency primary AC drive circuit 14b connected to drive the primary 20 of power or isolation transformer T'. Switched alternating current power of substantially square waveform thus appears across the secondary 22 of transformer T' which has a grounded center tap 24. Hence, at secondary terminals A' and B' a square waveform alternating current is produced having relatively high frequency and alternating between $+V$ and $-V$ as shown by waveforms adjacent A' and B' of FIG. 2b.

Pulse width modulator 16 receives an input signal, such as an audio signal for Class D amplification, or a reference voltage, the latter being used, for example, as a reference for regulating a power supply voltage output or controlling a servo system output. In response to the input signal, modulator 16 produces a pulse width variable control signal. As is well known, the pulse width modulated signal (PWM) is characterized by a train or sequence of electrical pulses, the width of each pulse being variable in accordance with the magnitude of the input signal Si. In this case, pulse width modulator 16 is provided by a triangular generator 26 and a comparator 28. The PWM signal appears at an output of comparator 28 and is applied to a terminal C' of logic 18. Its waveform is shown at C' in FIG. 2b and varies between two fixed levels, here being $+V$ and $-V$. As the triangular function of generator 26 crosses the instantaneous level of the input signal Si, comparator 28 swings from one output state such as $-V$ to the opposite output state $+V$ and then subsequently returns to the state $-V$ when the triangle function drops below the input Si signal level.

Output switch steering logic 18 is the heart of circuit 10 and is connected to receive the PWM signal from modulator 16 at an input terminal C' and is also connected to receive the instantaneous polarity states of the power AC at terminals A' and B'. Logic 18 senses the polarity of the AC at terminals A' and B' and depending on the logic state of the PWM signal at terminal C', selectively operates output switches S1' and S2' via switch control leads as shown, to apply the proper polarity and duty cycle timing of the AC power to output terminal D'. Power delivered to terminal D' thus switches between high and low levels (or polarity) with the average duration of the higher, or in this case, positive polarity $+V$ voltage being proportional to the magnitude of the input signal Si. The switched output waveform is shown next to D' in FIG. 2b. Since the electrical power delivered to output terminal D' includes the cyclical switching transients of switches S1' and S2' at the AC rate, low pass filter F' filters out these frequency components before delivering the desired, smoothed output voltage or signal So. It is noted that circuit 10 with logic 18 operates to produce the desired power switching at terminal D' directly from the AC source without the need of an intervening AC to DC rectification stage at the secondary side of the transformer T'.

By comparison, the prior art pulse width modulation amplifier 12 of FIG. 1b has a similar configuration to circuit 10 except for the rectification, diode rectifier 30 and filtering capacitor 32, at the secondary output of the power transformer T. Diode rectifier 30 in the prior art circuit converts the alternating current power available from the power transformer into direct current and applies the DC to terminals A and B as shown by the steady levels +V at terminal A and −V at terminal B in the waveforms of FIG. 1b. Output switches S1 and S2 of amplifier 12 are driven at C by the pulse width modulator to close and open, (one switch lead being inverted by inverter 32 for opposite phase operation), so as to alternately connect the DC voltages on terminals A (+V) and B (−V) to output terminal D. Although this prior art amplifier 12 operates satisfactorily for many applications, it does require the additional rectification stage of rectifier 30 and filtering capacitors 32 which create power loss as well as add to the part count of the circuit.

Synchronous modulation circuit 10 provides optimum operation when the secondary voltage at terminals A' and B' is substantially a square wave. This allows steering logic 18 to achieve sharp switching transitions in response to the polarity of the signals at A' and B' as well as the PWM waveform at C'.

The frequency of the alternating current power source 14 is not critical, except that it is preferably higher than the frequency of the information components in the input signal. Normally, a square wave at the output of source 14 will have a period of from two microseconds to about 50 microseconds. The appropriate period will be selected depending upon the frequency content of the input signal Si. When circuit 10 is used as a Class D audio amplifier, with input signal Si having a frequency range of 10 to 20 kHz, the frequency of source 14 should be higher than the upper limit of the audio band. To remove switching transients from the output audio signal or other amplified variable signal, low pass filter F' should provide a roll-off frequency chosen to be significantly higher than the upper limit of the input signal frequency range. For example, the roll-off frequency of filter F' for an audio amplifier should be in the range of 40 to 50 kHz.

Now with reference to FIG. 3a, preferred implementations of output switch steering logic 18 and pulse width modulator 16 are shown. Steering logic 18 has, in this embodiment, two symmetrical sections, 18a and 18b, one each for controlling an associated output switch S1' and S2', respectively, in accordance with the combined instantaneous logic or polarity states of the AC power signals at terminals A' and B' and the low power logic PWM signal at C' produced by modulator 16. Each logic section 18a and 18b has the capability of detecting the instantaneous polarity at the associated power terminal A' or B'. Depending upon the state of the PWM signal and the polarity of the AC at terminals A' and B', logic 18 produces switch control outputs on the associated output leads 50 and 52, respectively, for operating the output switches S1' and S2'.

Logic section 18a includes a first logic branch of NAND gate 54 having inputs respectively connected to the A' power terminal and the C' PWM terminal for producing a low logic level when A' and C' are both high. That logic state is inverted by inverter 56 and passed through a blocking diode 58 to output junction 60 connected to V- through a hold down resistor R1. The other branch of logic section 18a includes inverters 62 and 64 connected respectively to the PWM signal at C' and the power signal at A' and having outputs applied to NAND gate 66, the output of which is low when terminals A' and C' are both low. An inverter 68 inverts the output from NAND gate 66 and applies the result through a blocking diode 70 to junction 60. As a result, logic section 18a causes switch S1' to close when A' and C' are both high, or both low, as depicted in the truth table shown in FIG. 3c.

Logic section 18b is symmetrical to logic section 18a and includes NAND gate 74, inverter 76, blocking diode 78, inverters 82 and 84, NAND gate 86, inverter 88, and blocking diode 90. The logic produces a switching signal at output junction 100, which in turn is pulled down to low logic level V- connected through pull down resistor R2. Thus the logic steering of section 18b is the complement of section 18a and provides for closing output switch S2' when the signal conditions at B' and C' are both high, or both low, as shown in the truth table of FIG. 3c.

Preferably, switches S1' and S2' as shown in FIG. 3a are semiconductor power switches of a well known type such as switches 4016 available from National Semiconductor Corporation, Santa Clara, Calif.

Modulator circuit 16 is preferably synchronized to the alternating current power waveform at the output of source 14. Here this is achieved by a flip-flop 102 with a clock input connected over lead 104 to the A' terminal of source 14. Flip-flop 102 is thereby clocked or toggled on each positive going A' edge of the alternating current output signal from source 14. The Q output of flip-flop 102 is applied through an integrator circuit including operational amplifier 106 and an RC circuit of resistor 108 and integrating capacitor 110 to produce a triangular waveform on output lead 112 synchronized to the AC power source transitions. This triangular waveform is then connected to one input of comparator 28 with the other input receiving signal Si. The result is a pulse width modulated output signal as shown by waveform C' in FIG. 3b.

The filter F' at the output stage is here shown as a simplified RC low pass filter of resistor R3 and capacitor C1. The values of these components are selected to provide the desired roll-off filter characteristics in accordance with the previously stated criteria.

As shown by the waveforms of FIG. 3b, output switch steering logic 18 determines which of the two possible power terminals, A' or B', is to be connected to output terminal D' at any given instance for correct pulse polarity in combination with the variable information content of the pulse width modulated waveform at terminal C'.

Figure 4:
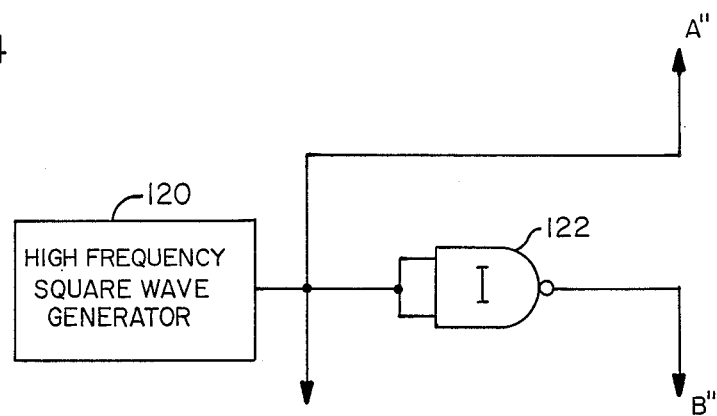
FIG. 4 is a circuit diagram of one form of the square wave AC power source shown as a generalized functional block in the FIG. 3a amplifier circuit.

With reference to FIG. 4, one example of the square wave alternating current power source 14 is shown to be provided by a low voltage, relatively high frequency square wave (20 kHz, 10 volt peak-to-peak) generator 120. The output of generator 120 is converted to a bipolar output signal by means of inverter 122. The alternating current source 14 shown in FIG. 4 is suitable for an audio amplifier requiring a relatively high AC frequency, together with relatively low power at the switched output stage.

Figure 5:
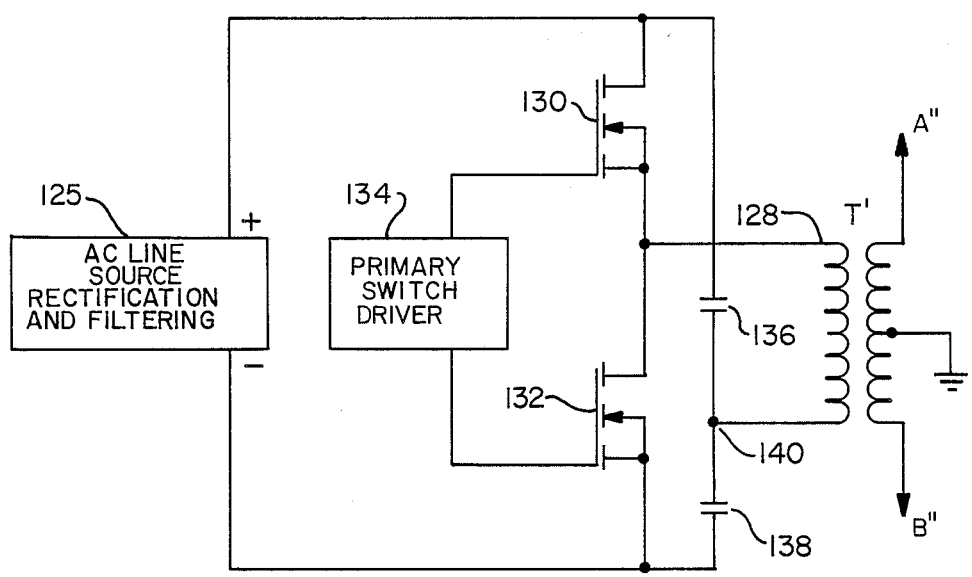
FIG. 5 is another circuit diagram of an alternative AC power source for the amplifier circuit of FIG. 3a having a rectified AC to DC power source and a primary AC drive circuit driving a switched power transformer for delivering the alternating current power to the steering logic and output switches.

In FIG. 5, an exemplary circuit is shown for the conventional high frequency primary drive circuit 14b shown by block diagram in FIG. 2a. In this case, the alternating current power delivered at the output of transformer T' is of relatively high voltage, high power for use as a regulated power supply output, a servo controlled load or power amplifier. Rectified and filtered AC line source 125 provides the DC power which in turn is switched with alternating polarity and at a desired frequency into primary winding 128 of the transformer T' by a pair of CMOS transistor switches 130 and 132 driven by primary switch driver 134 and with capacitors 136 and 138 connected to provide DC reference between the opposite polarity leads of source 125 and one terminal 140 of the primary winding 138.

While only particular embodiments of the synchronous modulation circuit according to the invention have been disclosed herein, it will be readily apparent to persons skilled in the art that numerous changes and modifications can be made thereto, including the use of equivalent means, devices, and methodology, without departing from the spirit of the invention.

What is claimed is:

1. Synchronous modulation circuit, comprising:
  input means for receiving an input signal;
  output means for producing an electrical output signal;
  alternating current source means having a transformer including first and second terminals at a secondary winding and producing opposite phase alternating current power signals at said terminals;
  pulse width modulation means for producing a sequence of variable width pulses, said pulse width modulation means being connected to said input means for varying the width of said pulses in accordance with the input signal;
  output switching means for selectively connecting said first and second terminals to said output means; and
  steering logic means including logic gates having inputs connected to said first and second terminals of said alternating current source means and to said pulse width modulation means, and having a control output connected to said output switching means, said steering logic means being responsive to the combined instantaneous logic states of signals at said first and second terminals and to an instantaneous logic state of said variable width pulses from said pulse width modulation means to cause said output control to operate said output switching means to connect said first terminal to said output means when logic signals at said first terminal and at an output of said pulse width modulation means are of the same logic state, and to connect said second terminal to said output means when logic signals at said second terminal and at said output of said pulse width modulation means are of the same logic state so as to deliver a variable amount of power to said output means in accordance with variation of the input signal.

2. The synchronous modulation circuit of claim 1, wherein said output switching means comprises first and second signal controlled semiconductor switches, one for connecting each associated one of said first and second terminals, respectively, to said output means, and wherein said steering logic means comprises first and second sections respectively connected for operating said first and second semiconductor switches, each of said steering logic sections comprising logic gates connected to detect when the logic states of the associated terminal and the output of said pulse width modulation means are both high logic or both low logic and to close the associated one of said first and second semiconductor switches when either of these two logic conditions exist.

3. The synchronous modulation circuit of claim 2, wherein said first and second sections of said logic steering means comprise solid state NAND gates and inverters connected through blocking diodes to an output junction at which an output control lead produces a switch control signal for operating the associated one of said first and second semiconductor switches.

4. A synchronous modulation circuit for amplification, control and power applications, comprising:
  alternating current source means having first and second terminals and producing opposite phase alternating current signals at said terminals;
  pulse width modulation means for producing variable width pulses in response to an input signal;
  output switching means for selectively connecting said first and second terminals to an output means; and
  steering logic means connected to at least one of said first and second terminals of said alternating current source means and to said pulse width modulation means, and having switch control means connected to said output switching means, said steering logic means having logic signal inputs responsive to the combined instantaneous logic states of said alternating current source means at said first and second terminals and of said variable width pulses at an output of said pulse width modulation means, to cause said output switching means to alternately connect said first and second terminals to said output means so as to deliver a variable amount of power thereto in accordance with the input signal.

5. The synchronous modulation circuit of claim 4, wherein said steering logic means comprises logic gates having inputs connected to at least one of said first and second terminals for sensing an instantaneous logic state of said alternating current source means at said one of said terminals, and said logic gates having another input connected to said pulse width modulation means for determining an instantaneous logic state of said variable width pulses to produce at said switch output control means a control signal that depends on the combined logic states at said inputs of said logic gates.

6. The synchronous modulation circuit of claim 4, wherein said steering logic means comprises logic gates for causing said output switching means to connect said first terminal to said output means when signals at said first terminal means and an output of said pulse width modulation means are of the same logic state, and for causing said output switching means to connect said second terminal to said output means when signals at said second terminal and at said output of said pulse width modulation means are of the same logic state.

7. The synchronous modulation circuit of claim 6, wherein said output switching means comprises first and second signal controlled semiconductor switches, one for connecting each associated one of said first and second terminals, respectively, to said output means, and wherein said steering logic means comprises first and second sections respectively connected for operating said first and second semiconductor switches, each of said steering logic sections comprising logic gates connected to detect when the logic states of the associated terminal and the output of said pulse width modulation means are both high logic or both low logic and to close the associated one of said first and second semiconductor switches when either of these two logic conditions exist.

* * * * *